United States Patent [19]

Dautartas et al.

[11] Patent Number: 5,472,886
[45] Date of Patent: Dec. 5, 1995

[54] STRUCTURE OF AND METHOD FOR MANUFACTURING AN LED

[75] Inventors: Mindaugas F. Dautartas, Alburtis, Pa.; Jose A. Lourenco, Union, N.J.

[73] Assignee: AT&T Corp., Murray Hill, N.J.

[21] Appl. No.: 364,368

[22] Filed: Dec. 27, 1994

[51] Int. Cl.[6] .................................................. H01L 33/00
[52] U.S. Cl. .................... 437/23; 437/127; 437/183; 437/905
[58] Field of Search ........................ 437/179, 180, 437/182, 192, 193, 23, 129, 127, 126, 905; 148/DIG. 99

[56] References Cited

U.S. PATENT DOCUMENTS

| | | |
|---|---|---|
| 3,914,137 | 10/1975 | Huffman et al. . |
| 3,936,694 | 2/1976 | Akiyama . |
| 4,255,755 | 3/1981 | Itoh et al. . |
| 4,342,148 | 8/1982 | SpringThorpe et al. . |
| 4,476,620 | 10/1984 | Ohki et al. . |
| 4,538,342 | 9/1985 | Camlibel et al. ........................ 437/23 |
| 4,788,161 | 11/1988 | Goto et al. . |
| 4,890,383 | 1/1990 | Lumbard et al. . |
| 4,958,202 | 9/1990 | Kinoshita et al. ........................ 437/23 |
| 5,135,877 | 8/1992 | Albergo et al. ........................... 437/23 |
| 5,179,609 | 1/1993 | Blonder et al. . |
| 5,242,839 | 9/1993 | Oh et al. ................................. 437/129 |
| 5,242,840 | 9/1993 | Kim ............................................ 437/4 |
| 5,257,336 | 10/1993 | Dautartas . |
| 5,259,054 | 11/1993 | Benzoni et al. . |
| 5,337,398 | 8/1994 | Benzoni et al. . |
| 5,358,880 | 10/1994 | Lebby et al. ............................ 437/127 |

FOREIGN PATENT DOCUMENTS

| | | | |
|---|---|---|---|
| 62-179179 | 8/1987 | Japan | ..................... 437/23 |
| 62-262471 | 11/1987 | Japan | ..................... 437/23 |

*Primary Examiner*—Tom Thomas
*Assistant Examiner*—Kevin M. Picardat

[57] ABSTRACT

An LED has both its p and n bonding pads on the p side of the wafer for simultaneous solder bump alignment and electrical connection of the LED with a device carrier. A groove is formed dividing the p material of the device into an active region and an inactive region. The groove also provides a path for the device's n-contact, which extends from the n-material at the base of the groove, up the side of the groove, to the n bonding pad on the surface of the inactive p material.

14 Claims, 5 Drawing Sheets

5,472,886

STRUCTURE OF AND METHOD FOR MANUFACTURING AN LED

FIELD OF THE INVENTION

This invention relates generally to the structure and manufacture of a double heterostructure light emitting diode or laser diode (collectively abbreviated "LED") for use in devices where the LED must be aligned with great accuracy to the device carrier, as, for example, in the optical communications field. More particularly, the invention relates to an LED with both the p-contact and the n-contact on the same side, permitting the solder bonding pads to be configured so that precise solder bump self alignment is achieved without shorting between the pads and without the need for bonding wires.

BACKGROUND OF THE INVENTION

LEDs used as light sources in fiber optic communications must be precisely aligned to the device carrier, so that the optical emission from the device may be accurately directed into an optical communications fiber. Currently available LEDs with output suitable for use in optical communications have bonding pads on opposite surfaces. This structure has presented difficulties in mass producing optical devices that require alignment between LED and fiber, as explained in the Detailed Description below.

This alignment problem has sometimes been addressed by attaching the LED to an intermediate mounting which is subsequently attached to a base member and optically aligned to a fiber connector using an active alignment technique.

U.S. Pat. No. 5,337,398, which is assigned to the assignee of the present invention, and is hereby incorporated by reference, discloses an optical package utilizing solder bump self-alignment of the LED. That optical package has a base member provided with a plurality of bond pads sites for the self alignment as well as the electrical connection of an LED device directly to the base member. In addition, the base member has associated mechanical fiducials for the alignment of other optical mounting components: a spherical lens holder and a fiber ferrule receptacle. In this way, all the optical components are passively aligned when they are attached to the base member, and no subsequent alignment operation is required.

SUMMARY OF THE INVENTION

The present invention provides a structure of and a method for manufacturing an LED with an optical output suitable for the communications field, and with both bonding pads on the same surface. The LED is preferably both aligned and electrically connected to the device carrier during a single solder bonding operation. Because both contacts of the LED are on the same side of the device, the need for a wire bond to the LED is eliminated.

A groove on the p-surface of the device extends through the p-material into the n-material below. The groove allows an n-contact, which is deposited in part on the p-surface, to make electrical contact with the n-material below. A p-contact is deposited on another part of the p-surface. Metal bonding pads over metallic film areas in contact with the p- and n-contacts allow a mechanically stable, reliable and low stress solder joint to the base member.

Non-wetting surfaces surround the metal bonding pads, preventing shorts from forming between the bonding pads or across the p-n junction during solder reflow, thereby making solder attachment of the LED to the base member a reliable batch process.

In one embodiment, the LED device is manufactured from a standard double-heterostructure wafer, such as indium gallium arsenide phosphide/indium phosphide (InGaAsP/InP). After etching a groove from the p-surface through the p-layers into an n-layer, a metal n-contact is applied which extends from the p-surface down one side of the groove to the n-material exposed at the bottom of the groove. A p-contact then is formed on the p-surface on the other side of the groove. A non-wetting dielectric is deposited on all surfaces surrounding the contacts, and openings are formed in the dielectric exposing the contacts. All surfaces are then covered with a metal film, and thick metal bonding pads are formed over the areas of the p-and n-contacts. Finally, the metal film left exposed after adding the bonding pads is removed, leaving non-wetting dielectric material surrounding the bonding pads.

Other and further advantages of the present invention will be apparent during the course of the following discussion and by reference to the accompanying drawings.

DETAILED DESCRIPTION

Figure 1:
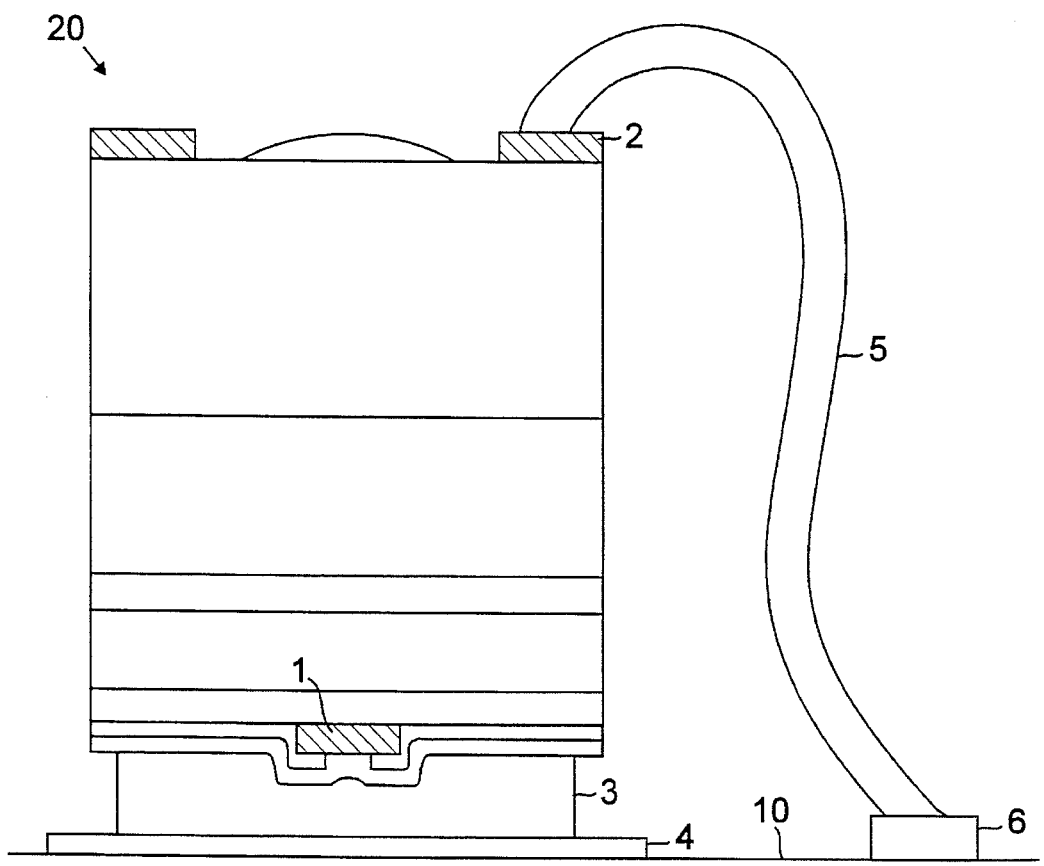
FIG. 1 is a cross sectional view of a known double heterostructure InGaAsP/InP LED.

The physical structure of a currently available LED suitable for use in optical communications has presented manufacturability difficulties with respect to the mass production of optical devices having the required alignment between LED and fiber. As shown in FIG. 1, a currently available LED 20 having a double heterostructure wafer configuration typically has a p-contact 1 and an n-contact 2 located on opposite surfaces of the device, most often the top and bottom. In mounting such an LED on a device carrier 10, a bonding pad 3 on the bottom surface is soldered to a contact 4 on the device carrier. During attachment of the LED to the device carrier, the LED is aligned by surface tension forces present in the molten solder, a technique referred to as solder bump self alignment. A bonding wire 5 must be used to connect the top, or n-contact 2 to a second contact 6 on the device carrier 10. Attaching the bonding wire adds the expense of a second operation, and may compromise the reliability and positioning accuracy of the device mounting operation. Further, the surrounding components in an optical package containing the LED of FIG. 1 must be designed to provide additional clearance for the bonding wire.

One embodiment of an LED according to the present invention, and an exemplary implementation of the device, will be explained with reference to FIGS. 2–4. The detailed structure and materials of an actual embodiment fabricated by the inventors, and a description of an exemplary manufacturing process, are disclosed below with reference to FIGS. 5A–5G.

Figure 2:
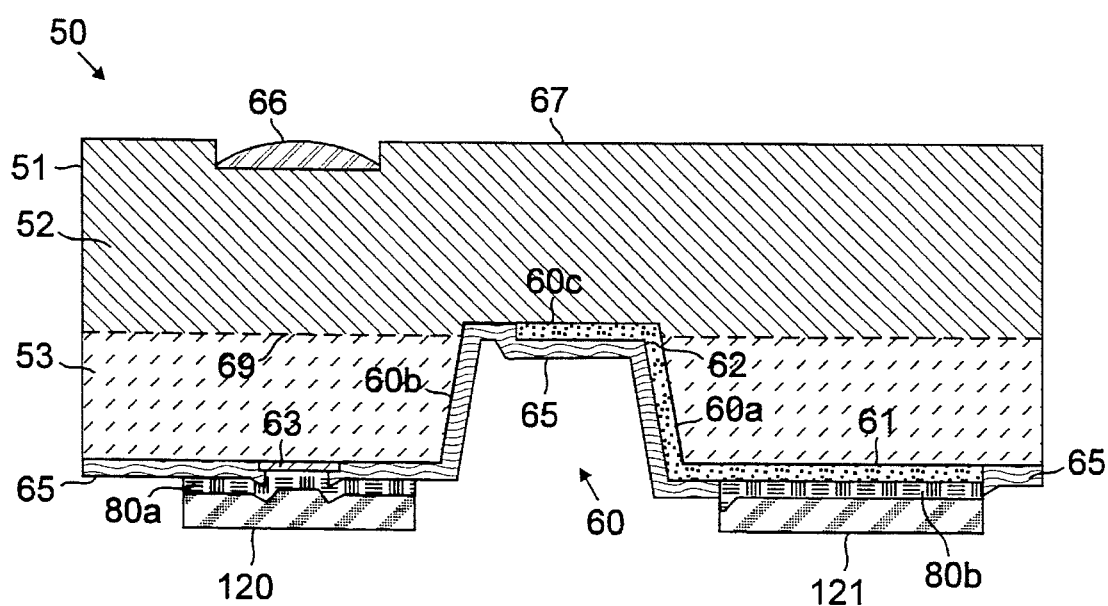
FIG. 2 is a schematic side elevational view in cross section of an LED according to the present invention.

As shown in FIG. 2, LED 50 comprises a wafer 51 having standard double heterostructure InGaAsP/InP construction. This construction was used in the embodiment fabricated by the inventors and is known in the art as being appropriate for use in LEDs used in optical communications devices. Other wafer constructions having appropriate optical output characteristics, such as another construction having an indium phosphide substrate, or a construction having a gallium arsenide (GaAs) substrate, could also be used. Wafer 51 has at least one n-layer 52 comprising an n-type substrate and at least one p-layer 53 comprising a p-type film. In an installed LED of the invention, the n-layer 52 is above the p-layer 53; that is, the n-layer is closest to the optical fiber in an installed device, and the p-layer is closest to the chip carrier.

A groove 60 extends upwardly from a p-surface 61 on the underside of the p-layer 53, completely through the p-layer, and to a depth sufficient to penetrate a portion of the n-layer 52. A metallic n-contact 62 extends from the n-layer 52 at the bottom 60c of the groove 60, along a first side 60a of the groove 60, to the p-surface 61. A p-contact 63 depends from the p-surface 61 adjacent a second side 60b of the groove 60.

Each of the p- and n-contacts are in electrical contact with separate thin metallic film areas 80a and 80b. Attached to these film areas are thick metal bonding pads 120 and 121. The bonding pads are shaped so as to optimize the locating forces created by solder bump surface tension, while providing a sufficient heat sink during LED operation.

Dielectric film 65 covers all surfaces surrounding the metal bonding pads 120 and 121 on the underside of LED 50, including areas of the p-surface 61 surrounding the bonding pads, and the sides and base of the groove 60. The dielectric film is non-wetting as to solder, and therefore prevents shorting of the device during the solder melt operation.

The LED further may have an integral lens 66 on n-surface 67, which increases the amount of light coupled into an optical fiber during device operation. The active light-emitting region of the diode lies at the p-n junction area 69 between the p-contact 63 and the lens 66. The portion of the p-layer 53 adjacent the first side 60a of groove 60 is electrically isolated from the active region of the diode, but serves as a spacer so that the bonding pad 121 is maintained at the same level as bonding pad 120.

Figure 3:
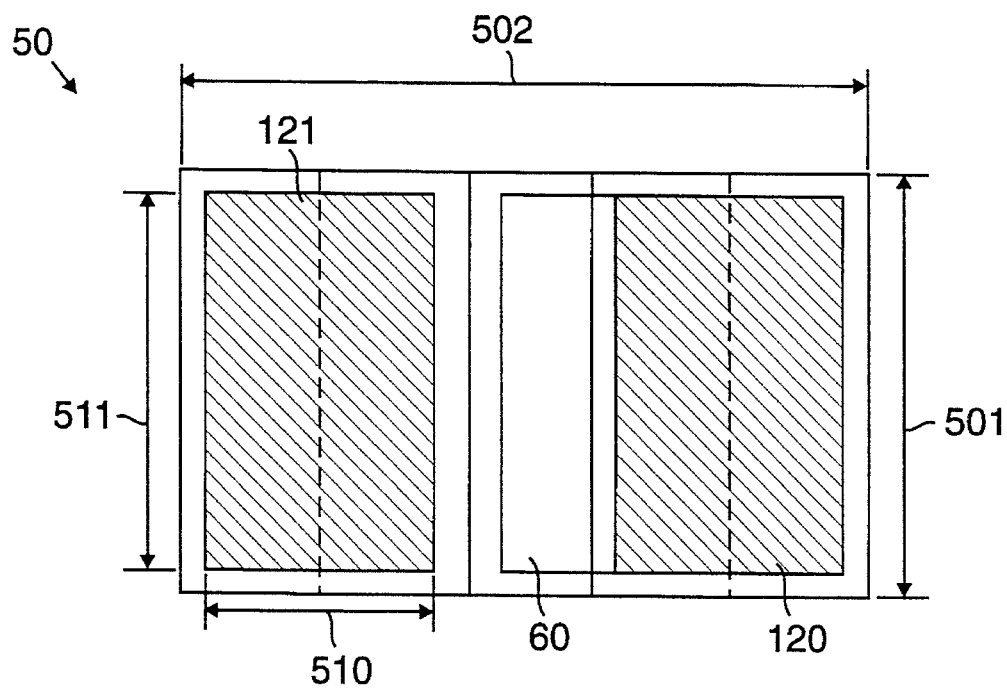
FIG. 3 is a bottom plan view of the LED according to the present invention.

FIG. 3 is a bottom plan view of an exemplary LED 50 according to the invention. The overall width 501 of the LED in this example is 0.250 mm, and the overall length 502 is 0.375 mm. An n- bonding pad 120 and a p- bonding pad 121 are disposed on opposite sides of groove 60. The two bonding pads 120 and 121 are of similar dimensions, having a width 510 of 0.125 mm and a length 511 of 0.200 mm. The use of two bonding pads as shown in FIG. 3 improves the efficiency of solder bump self alignment. Furthermore, while the bonding pads shown in FIG. 3 have sharp corners, rounded corners could be used to improve solder wetting characteristics.

Figure 4:
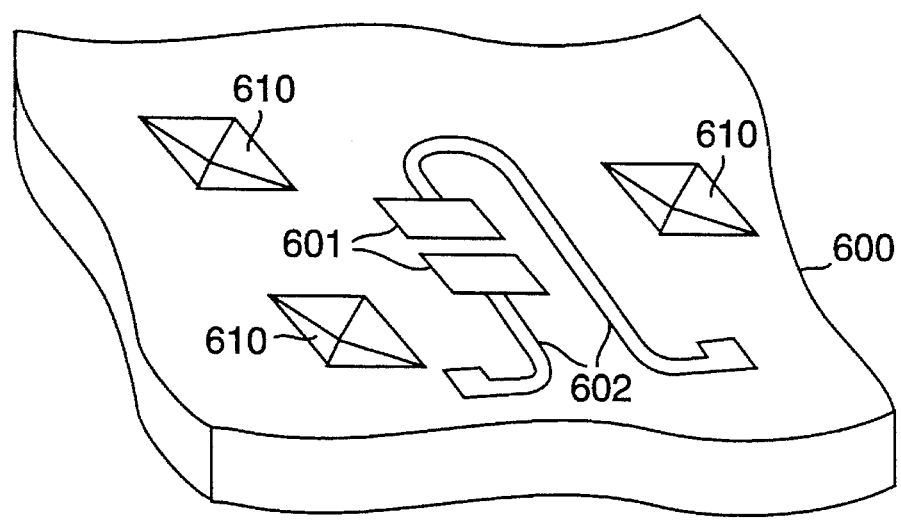
FIG. 4 is a perspective view of a silicon wafer prepared as a device carrier for an optical package that will contain an LED according to the present invention.

A typical chip carrier configuration for building an optical package using the LED of the invention is shown schematically in FIG. 4. A silicon wafer 600 forms the base material of the chip carrier. Two bond pad sites 601 are formed on the silicon wafer 600. The bond pad sites have a length and width close to those of bonding pads 120 and 121 of the LED. Leads 602 electrically connect the bond pad sites 601 to the optical package circuitry. Mechanical alignment fiducials 610 in the silicon wafer 600 are precisely located with respect to the bond pad sites 601, and mate with similar fiducials provided in the associated optical components (not shown), such as a lens holder and an optical fiber ferrule. The optical components are thereby passively aligned to the LED during the optical package assembly operations.

Steps in the process of manufacturing the above-described LED are related below with reference to FIGS. 5A–5G.

Figure 5A:
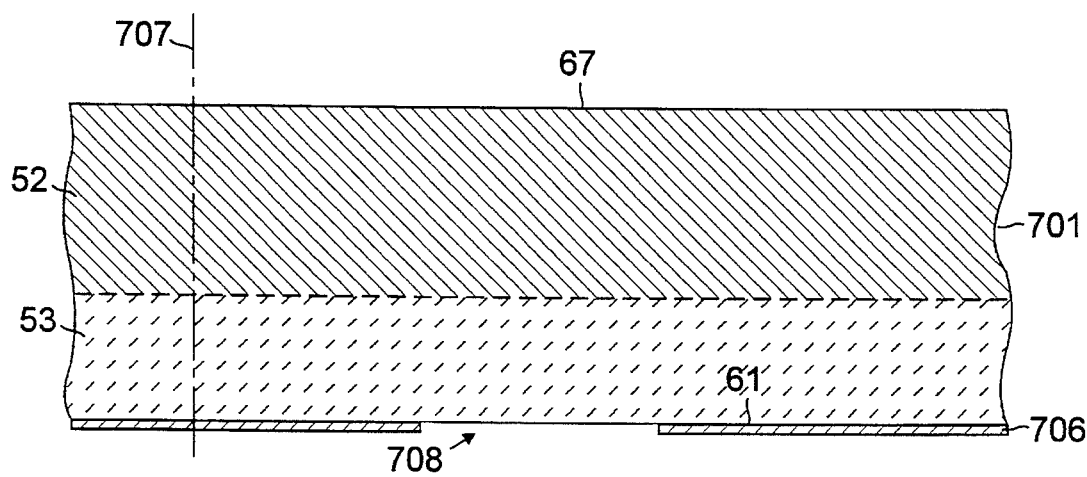
FIGS. 5A to 5G are schematic side elevational views in cross section of an LED in successive steps of a manufacturing process according to the present invention.

In this example, fabrication of the LED begins with a standard double heterostructure InGaAsP/InP wafer 701, with layer thickness and composition suitable for the fabrication of LEDs. Other compositions suitable for communications applications, such as GaAs, will be apparent to those skilled in the art. As shown in FIG. 5A, the wafer 701 has at least one p-layer 53 and a p-surface 61, and at least one n-layer 52 and an n-surface 67. The wafer further comprises primary crystallographic planes, such as plane 707.

A suitable chemical mask 706 is formed on the p-surface 61 of the wafer. The mask can be a dielectric mask, such as silicon dioxide or silicon nitride, or can be a photoresist mask that is chemically resistant to the chemical processes used in subsequent process steps. A stripe opening 708 is defined on the mask, parallel to primary crystallographic plane 707 of the wafer.

Figure 5B:
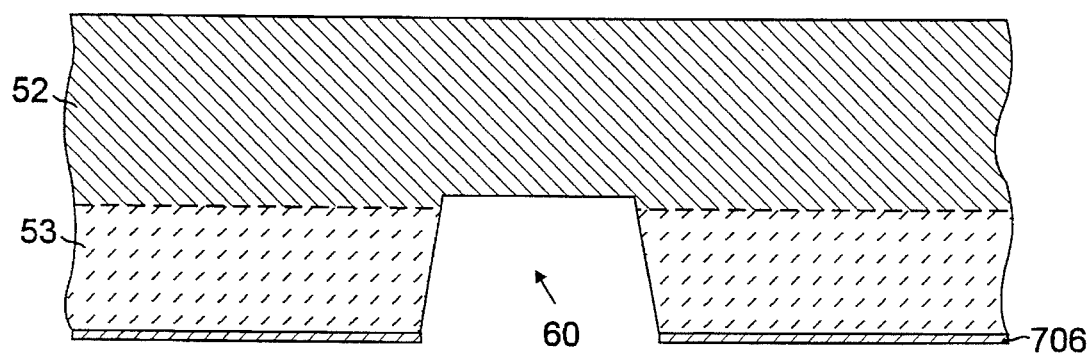

A groove 60 is etched in the semiconductor wafer at the opening 708 in the chemical mask 706, as shown in FIG. 5B. The groove 60 is etched using either a wet chemical or a dry etching technique. The groove is etched to a depth sufficient to completely penetrate the p-layer 53 of the wafer, and to expose the n-layer 52. The groove is not, however, etched so deep as to mechanically weaken the final LED device or to result in poor step coverage or discontinuous films on the walls of the groove.

It is important to select an etching technique that is non-preferential with respect to the various InP and InGaAsP layers, in order to avoid over- or undercutting the layers, which could interfere with subsequent step coverage. A suitable etchant is composed of hydrobromic acid, hydrogen peroxide and water in a 5:1:20 volume ratio; however, one skilled in the art will recognize that other etchants suitable for this purpose can be formulated. Such etchants must not be reactive with the chemical mask 706.

After the groove is etched, the chemical mask shown in FIG. 5B is removed and the underlying surfaces are cleaned, readying the wafer for the next step.

Figure 5C:
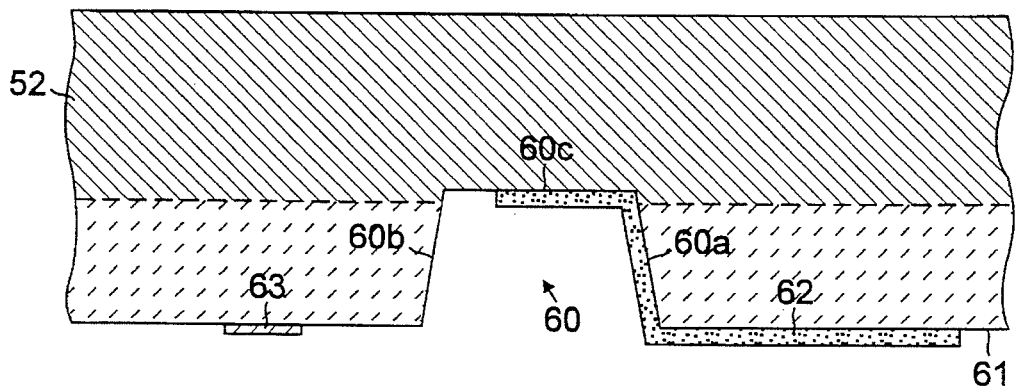
Figure 5D:
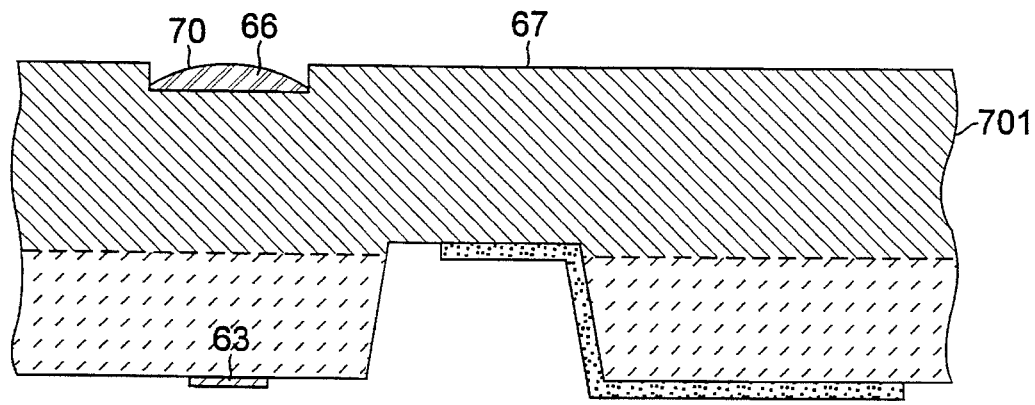

An n-contact 62 is then formed as shown in FIG. 5C, using photolithographic and deposition techniques known in the art. A suitable contact material is layered Au/Sn/Au which is subsequently alloyed by heat treatment, although other contact materials known in the art may be used. The n-contact 62 of this example is approximately 1–1.5 microns in total thickness. The n-contact 62 contacts the n-layer 52 at the base 60c of the groove, and forms a continuous film on the first side 60a of the groove 60 to the p-surface 61. The n-contact of this example extends across the p-surface adjacent the first side 60a of groove 60 to cover the area where bonding pad 122 will subsequently be applied. It is important that only the first side 60a, and not the second side 60b, of the groove 60 be covered with the n-contact metal in order to avoid short circuiting the device.

A p-contact 63, also shown in FIG. 5C, is formed on the p-surface of the device opposite groove 60 from the n-contact. A suitable contact metal known in the art, such as a AuBe film, is used. In this example, the contact is circular in plan view (not shown), being approximately 25 microns in diameter and 0.1 micron in thickness.

The wafer 701 is then thinned by removing material from the n-surface 67 until the wafer is the desired thickness. While not necessary for the functionality of the device, a lens 66, shown in FIG. 5D, can be integrally formed on the n-surface 67 aligned with the p-contact 63, to increase the amount of light coupled into an optical fiber. The lens is formed using the known technique of reactive-ion etching. An anti-reflective film 70 can be added to the lens.

Figure 5E:
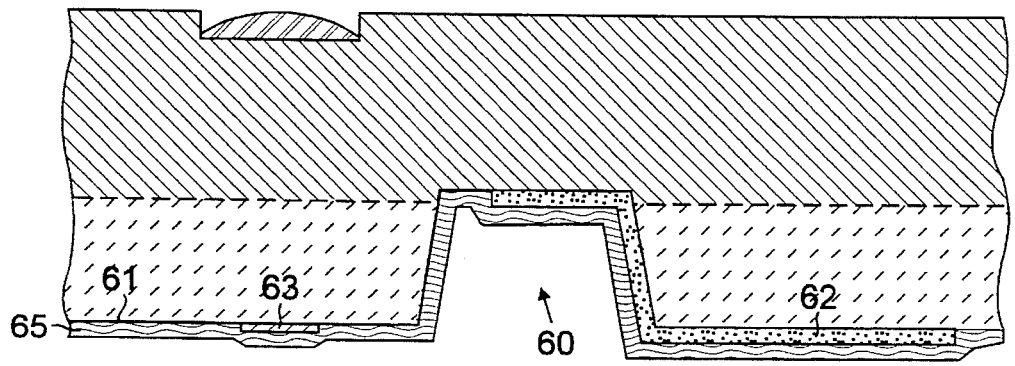

As illustrated in FIG. 5E, a dielectric film 65 is deposited over all features on the p side of the wafer, including the p-surface 61, the p-contact 63, the bottom 60c and walls 60a, 60b of the groove 60, and the n-contact 62. The dielectric film 65 isolates these features and seals the groove surfaces. The dielectric film used in the embodiment fabricated by the inventors was silicon nitride deposited to a thickness of approximately 0.2 microns. Other appropriate materials known in the art, such as silicon dioxide, can alternatively be used.

Figure 5F:
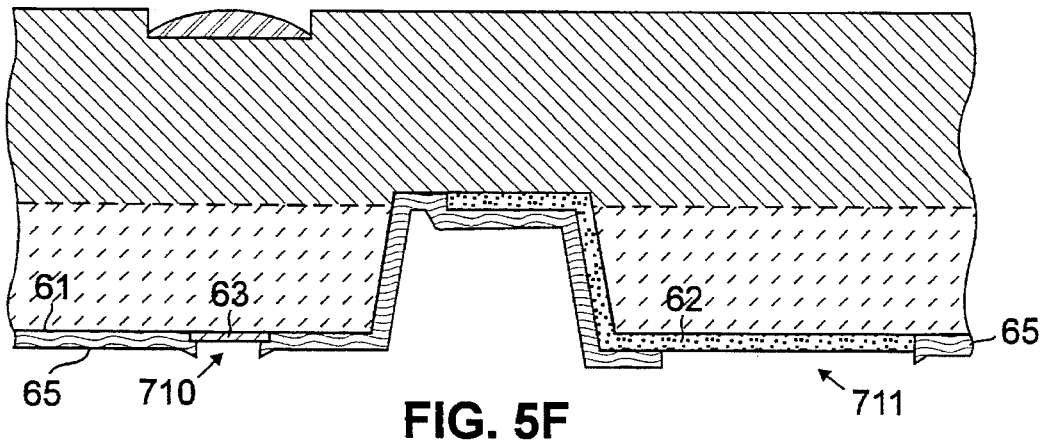

Openings 710, 711 are then defined in the dielectric film as shown in FIG. 5F, using standard photolithographic and etching processes. In this illustration, the diameter of opening 710 is slightly smaller than the diameter of the p-contact 63 and is centered over it, exposing the center portion of the p-contact. Opening 711 is defined in the position to be occupied by the bonding pad 121, as shown in FIG. 5G, and exposes a portion of the n-contact 62 located on the p-surface 61.

Figure 5G:
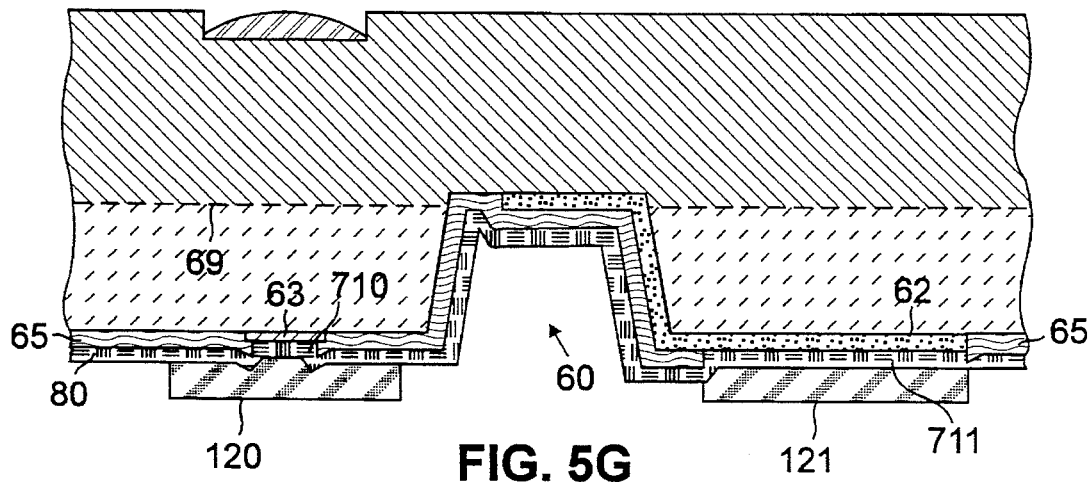

A metal film 80, shown in FIG. 5G, is then deposited over the dielectric film 65 and the openings 710, 711. In this example, a layered TiAu metal film comprising approximately 0.2 microns titanium and 0.5 microns gold is used. This composition provides good adhesion and conductivity for bonding pads 120, 121 to be subsequently applied, and the TiAu film can be partially etched later in the processing sequence to isolate the n- and p-contacts 62, 63.

Using photolithographic techniques, footprints for bonding pads 120, 121 centered on the n- and p-contacts 62, 62 are defined on the metal film 80, and thick gold bonding pads 120, 121 are formed on these footprints. In this example, the pads are formed by electroplating to a thickness of 5 microns. Other methods, such as evaporation techniques, and other thicknesses in the range of about 4 to 10 microns, could also be used. The gold bonding pads 120, 121 must be thick enough to serve both as a heat sink under the p-contact 63 as a cushion between the solder bond and the semiconductor after die attachment, but not so thick as to cause wafer breakage and waste gold.

The metal film 80 remaining exposed around the gold bonding pads 120, 121 is then removed to again expose the dielectric film 65. As shown in FIG. 2, metal film portion 80a below bonding pad 120 and metal film portion 80b below bonding pad 121 are left intact. Since the remaining dielectric film 65 will not be wetted by the solder during die attachment, this step will ensure that shorting will not take place across the bonding pads 120, 121 during solder bond.

The finished wafer is then diced using standard processes, such as scribe-and-break, forming the finished LED device 50 as shown in FIG. 2. The LED chip is now ready to be bonded to a carrier board.

It should be understood that the above-described embodiments of the present invention are exemplary only. For example, gallium arsenide may be preferable over indium phosphide as the basic wafer material in some applications. Various other modifications will be apparent to those skilled in the art and are considered to fall within the scope of the present invention.

We claim:

1. A method for fabricating an LED from a double heterostructure wafer having a p-surface, an n-surface, an n-layer and a primary crystallographic plane, comprising:

etching a groove in the p-surface parallel to the crystallographic plane, said groove exposing the n-layer of the wafer;

forming a metal n-contact, said n-contact contacting said exposed n-layer and forming a continuous film up a wall of said groove and onto the p-surface;

forming a metal p-contact on the p-surface opposite said groove from said n-contact;

depositing a dielectric film on the p-surface, on said p- and n-contacts, and in said groove;

defining openings in said dielectric film partially exposing said p-contact and said n-contact;

depositing a metal film over said dielectric film and said openings;

defining bonding pads sites on said dielectric film over said p- and n-contacts;

forming bonding pads on said bonding pads sites;

removing said metal film around said bonding pads to expose said dielectric film.

2. The method of claim 1, further comprising forming a chemical mask defining a stripe opening before etching said groove, and removing the chemical mask and cleaning the p-surface after etching said groove.

3. The method of claim 2, wherein the chemical mask is a dielectric mask selected from the group consisting of silicon dioxide and silicon nitride.

4. The method of claim 2, wherein the chemical mask is a photoresist mask.

5. The method of claim 2, wherein said groove is etched using an etchant comprising 5 parts hydrobromic acid, 1 part hydrogen peroxide and 20 parts water by volume.

6. The method of claim 1, wherein said n-contact is formed of alloyed Au/Sn/Au.

7. The method of claim 1, wherein said metal film comprises a layer each of titanium and gold.

8. The method of claim 1, wherein said Au bonding pads have a thickness between 4 microns and 10 microns.

9. The method of claim 1, further comprising the step of forming an integral lens in said n-surface opposite said p-contact after the step of forming a metal p-contact.

10. A method of manufacturing an LED, comprising:

etching a groove on a p-surface of a semiconductor wafer to expose an n-layer;

forming an n-contact extending from said n-layer to said p-surface;

forming a p-contact on said p-surface;

depositing a dielectric layer over said p-surface and said groove;

forming two bonding pads on said p-surface, one each in electrical contact with said n-contact and said p-contact.

11. The method of claim 10, wherein said semiconductor comprises a substrate selected from the group consisting of indium phosphide and gallium arsenide.

12. The method of claim 10, further comprising the steps of forming a metal film in contact with the p- and n-contacts before forming said bonding pads, and removing an exposed portion of said metal film after forming said bonding pads.

13. The method of claim 12, wherein said metal film comprises a layer each of titanium and gold.

14. The method of claim 10, wherein said bonding pads are gold having a thickness between 4 and 10 microns.

\* \* \* \* \*